(12) United States Patent
Vogt

(10) Patent No.: US 7,417,883 B2
(45) Date of Patent: Aug. 26, 2008

(54) I/O DATA INTERCONNECT REUSE AS REPEATER

(75) Inventor: Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/027,004

(22) Filed: Dec. 30, 2004

(65) Prior Publication Data

US 2006/0146637 A1    Jul. 6, 2006

(51) Int. Cl.
*G11C 5/06* (2006.01)
(52) U.S. Cl. .................... 365/63; 365/72; 711/5
(58) Field of Classification Search ........... 711/115
See application file for complete search history.

(56) References Cited

U.S. PATENT DOCUMENTS

| | | | | |
|---|---|---|---|---|
| 4,884,237 | A * | 11/1989 | Mueller et al. ............... | 365/63 |
| 5,119,340 | A * | 6/1992 | Slemmer ............... | 365/230.03 |
| 6,282,588 | B1 * | 8/2001 | Yamamoto ................. | 710/27 |
| 6,316,980 | B1 | 11/2001 | Vogt et al. ................. | 327/273 |
| 6,477,614 | B1 * | 11/2002 | Leddige et al. ............... | 711/5 |
| 6,487,102 | B1 * | 11/2002 | Halbert et al. ............... | 365/51 |
| 6,622,214 | B1 | 9/2003 | Vogt et al. ................. | 711/141 |
| 6,622,227 | B2 | 9/2003 | Zumkehr et al. ............... | 711/167 |
| 6,901,494 | B2 | 5/2005 | Zumkehr et al. ............... | 711/167 |
| 6,999,332 | B2 * | 2/2006 | Gamini et al. ............... | 365/51 |
| 7,061,785 | B2 * | 6/2006 | Miwa et al. ................. | 365/63 |
| 7,352,602 | B2 * | 4/2008 | Janzen ...................... | 365/63 |
| 2004/0090827 | A1 | 5/2004 | Dahlen et al. ............... | 365/200 |
| 2004/0093472 | A1 | 5/2004 | Dahlen et al. ............... | 711/158 |
| 2004/0126115 | A1 * | 7/2004 | Levy et al. .................. | 398/116 |
| 2004/0246767 | A1 | 12/2004 | Vogt ........................ | 365/154 |
| 2004/0246785 | A1 | 12/2004 | Vogt ........................ | 365/199 |
| 2004/0246786 | A1 | 12/2004 | Vogt ........................ | 365/199 |
| 2004/0250024 | A1 | 12/2004 | Vogt ........................ | 711/131 |
| 2004/0250153 | A1 | 12/2004 | Vogt ........................ | 713/500 |
| 2004/0250181 | A1 | 12/2004 | Vogt et al. ................. | 714/718 |
| 2004/0260991 | A1 | 12/2004 | Vogt et al. ................. | 714/738 |
| 2005/0071580 | A1 | 3/2005 | LeClerg et al. ............... | 711/154 |
| 2005/0108458 | A1 | 5/2005 | Vogt ........................ | 711/1 |
| 2005/0108465 | A1 | 5/2005 | Vogt ........................ | 711/100 |
| 2005/0108469 | A1 | 5/2005 | Freeman et al. ............. | 711/105 |

(Continued)

OTHER PUBLICATIONS

U.S. Appl. No. 10/883,474, filed Jun. 30, 2004, Pete D. Vogt.

(Continued)

*Primary Examiner*—Tan T. Nguyen
(74) *Attorney, Agent, or Firm*—Grossman, Tucker, Perreault & Pfleger, PLLC

(57) ABSTRACT

Some embodiments may include a memory with a first memory device and data pins, and a second memory device coupled with some of the data pins of the first memory device, allowing the first memory device to operate as a data repeater for the second memory device. An embodiment may comprise a memory device with a memory die, a first plurality of data pins to operate as input and output to the memory die, and a second plurality of data pins to function as a repeater. An embodiment method may involve configuring a first memory device as a repeater, sending data to the first memory device, and forwarding the data to a second memory device.

18 Claims, 4 Drawing Sheets

U.S. PATENT DOCUMENTS

| | | | |
|---|---|---|---|
| 2005/0108490 A1 | 5/2005 | Vogt | 711/167 |
| 2005/0108611 A1 | 5/2005 | Vogt | 714/758 |
| 2005/0152169 A1* | 7/2005 | Goto | 365/63 |
| 2005/0262388 A1 | 11/2005 | Dahlen et al. | 714/5 |
| 2005/0276150 A1 | 12/2005 | Vogt | 365/233 |
| 2006/0004953 A1 | 1/2006 | Vogt | 711/105 |
| 2006/0050822 A1 | 3/2006 | Panikkar et al. | 375/354 |

OTHER PUBLICATIONS

U.S. Appl. No. 11/173,641, filed Jun. 30, 2005, Swaminathan et al.
U.S. Appl. No. 10/859,060, filed May 31, 2004, Pete D. Vogt.
U.S. Appl. No. 11/027,237, filed Dec. 30, 2004, Pete D. Vogt.
U.S. Appl. No. 10/995,850, filed Nov. 22, 2004, Pete D. Vogt.
U.S. Appl. No. 11/027,291, filed Dec. 30, 2004, Pete D. Vogt.
U.S. Appl. No. 10/996,760, filed Nov. 23, 2004, Leelerg et al.
U.S. Appl. No. 11/141,668, filed May 31, 2005, McCall et al.
U.S. Appl. No. 11/097,955, filed Mar. 31, 2005, Pete D. Vogt.
U.S. Appl. No. 11/165,595, filed Jun. 22, 2005, Pete D. Vogt.
U.S. Appl. No. 11/165,582, filed Jun. 22, 2005, Pete D. Vogt.
U.S. Appl. No. 11/205,645, filed Aug. 16, 2005, Rosenbluth et al.

* cited by examiner

I/O DATA INTERCONNECT REUSE AS REPEATER

BACKGROUND

Semiconductor chips containing integrated circuits are typically packaged. The chip communicates with external circuitry through an interconnect, such as package pins or balls on the outside of the package. Interconnects provide numerous signals to chips, such as command or address signals, data signals, clocking signals, etc.

A trend of increasing complexity in semiconductors is well known. Advancements in fabrication, coupled with improvements in design, have resulted in significantly higher transistor counts for a given area of semiconductor. As chip complexity increases, so does interconnect complexity, for example by increasing the number of pins or balls on a package housing an integrated circuit.

Semiconductor chip packages may be stacked to increase chip density. When semiconductor chip packages are stacked, numerous interconnects must be provided to connect each package to a host, channel, or other circuitry. The numerous interconnects are therefore complex, costly and can occupy valuable space in stacked packages.

DETAILED DESCRIPTION

In the following description, numerous specific details are set forth. However, it is understood that embodiments of the inventions may be practiced without these specific details. In other instances, well-known circuits, structures, and techniques have not been shown in detail in order to improve the understanding of this description.

Reference in the specification to "one embodiment" or "an embodiment", etc., means that a particular feature, structure, or characteristic described in connection with the embodiment is included in at least one aspect of the invention. The appearances of the phrase "in one embodiment" in various places in the specification do not necessarily all refer to the same embodiment.

Generally, for memory chips arranged on a memory module, some memory chips may reuse a portion of their data pins and function as a repeater to other memory chips. In an embodiment a memory chip may have 16 data pins and use 8 pins as a repeater to other memory chips. Chips communicate with external circuitry through interconnects, such as package pins or balls on the outside of the package. Interconnects provide numerous signals to chips, such as command or address signals, data signals, clocking signals, etc. The broad term interconnect is used interchangeably with the term pin in this disclosure, but embodiments are not restricted to either case. The term pin is often used in industry data sheets even in reference to ball interconnects. Therefore the term pin is not restrictive and may be any type of interconnect, and is used herein merely as the most common term for interconnects in general.

Figure 1:
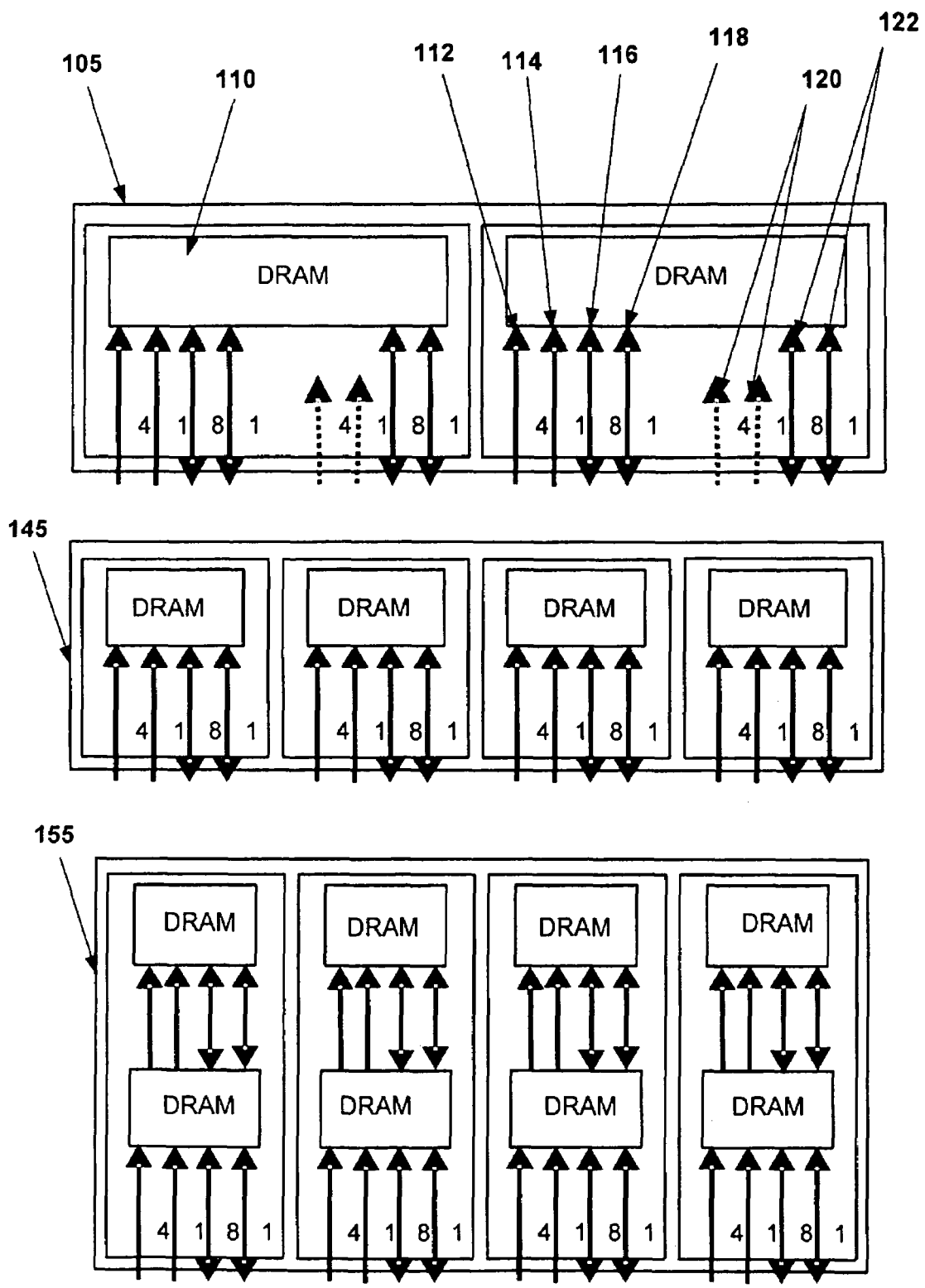
FIG. 1 illustrates memory chip configurations in memory modules.

FIG. 1 illustrates three different memory chip configurations in memory modules. FIG. 1 depicts DRAM memory chips, but embodiments of the invention may be any memory chip and need not be restricted to DRAM chips. FIG. 1 shows three example memory chip configurations, memory module 105, module 145, and module 155. In an embodiment the memory module is a Dual Inline Memory Module (DIMM). Numerous module configurations are possible Module 105 includes two DRAMs 110 with a wide data port consisting of multiple interconnects including command lines 112, a clock line 114, data lines 116, a data strobe 118, and another group of command and clock lines 120 as well as another group of data lines and data strobes 122, for each DRAM 110. Module 105 may have unused copies of command and address lines, such as command and clock lines 120, turned off, as represented by the arrows 120 extending only part way to the DRAM. Each DRAM 110 may have more inputs or outputs, but FIG. 1 is restricted to showing those inputs and outputs explained above in order to clarify description.

Module 145 has similar interconnects to module 105, but each DRAM only has half of the interconnects of the corresponding DRAM 110 in module 105. In this example, each DRAM in module 145 does not have the second group of command and clock lines 120 nor the second group of data lines and data strobes 122 that are present for each DRAM 110 on module 105. Module 155 has similar interconnects to each DRAM as 145 but has DRAMs in a stacked configuration.

Modules 145 and 155 therefore include multiple memory chips, similar to DRAMs 110 on module 105, and each memory chip has a data port consisting of multiple interconnects similar to module 105 including command lines 112, a clock line 114, data lines 116, a data strobe 118. Again, each memory chip may have more inputs or outputs, but FIG. 1 is restricted to showing those inputs and outputs explained above in order to clarify description.

Figure 2:
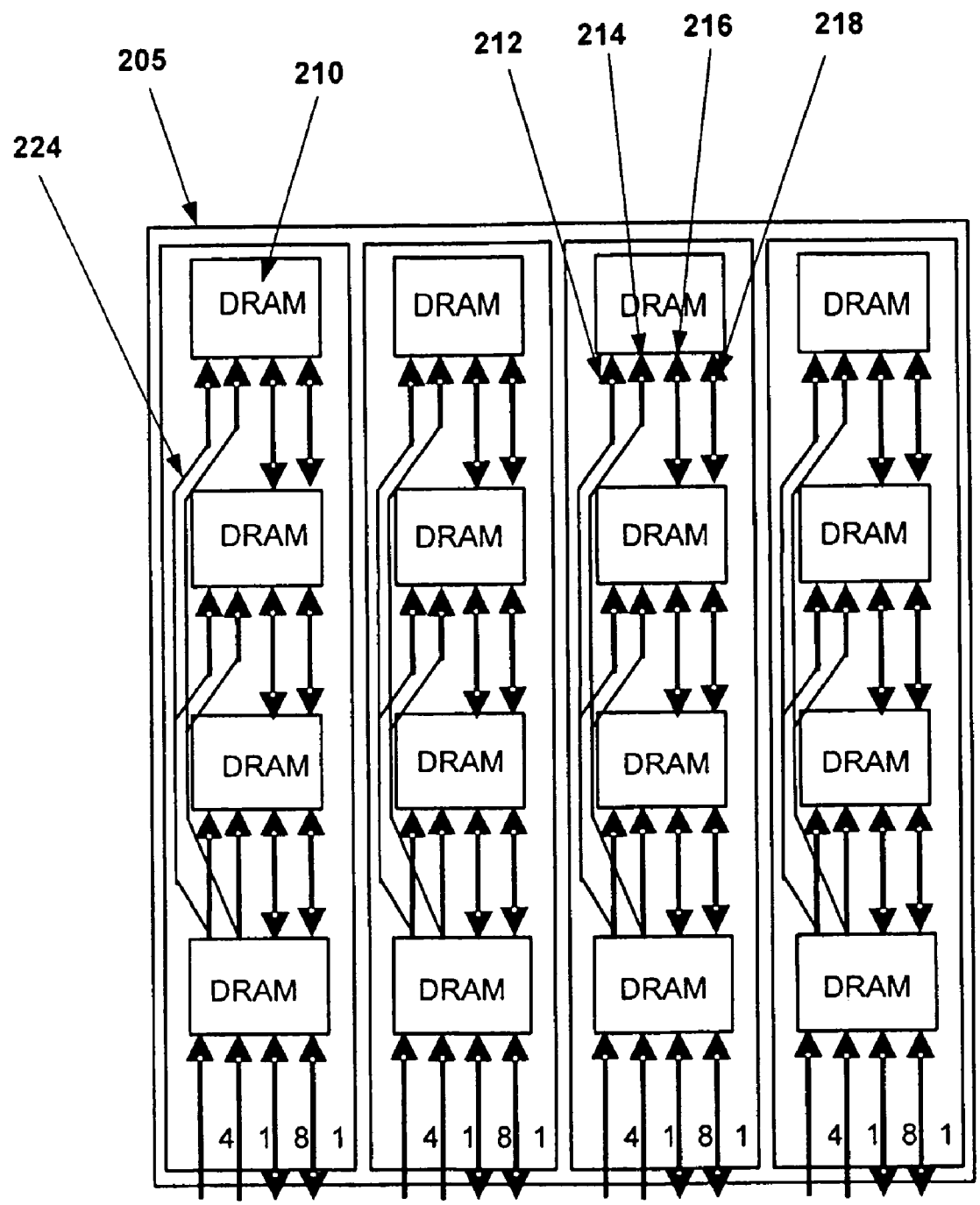
FIG. 2 illustrates a memory chip configuration for a memory module.

FIG. 2 illustrates a memory chip configuration for a memory module 205. As in FIG. 1, FIG. 2 depicts DRAM memory chips, but embodiments of the invention may be any memory chip and need not be restricted to DRAM chips. Module 205 has similar interconnects to module 105, but like modules 145 and 155 from FIG. 1, each DRAM has only half of the interconnects of the corresponding DRAM 110 in module 105. In this example, each DRAM in module 205 does not have the second group of command and clock lines 120 nor the second group of data lines and data strobes 122 as shown on module 105. Module 205 shows command and clock lines 224 that bypass intermediate memory chips to more quickly reach memory chips on the top of the module 205.

Module 205 has similar interconnects to each DRAM as 145 but has DRAMs in a stacked configuration. Module 205 therefore includes multiple memory chips and each memory chip has a data port consisting of multiple interconnects including command lines 212, a clock line 214, data lines 216, a data strobe 218. Again, each memory chip may have more inputs or outputs, but FIG. 2 is restricted to showing those inputs and outputs explained above in order to clarify description.

Figure 3:
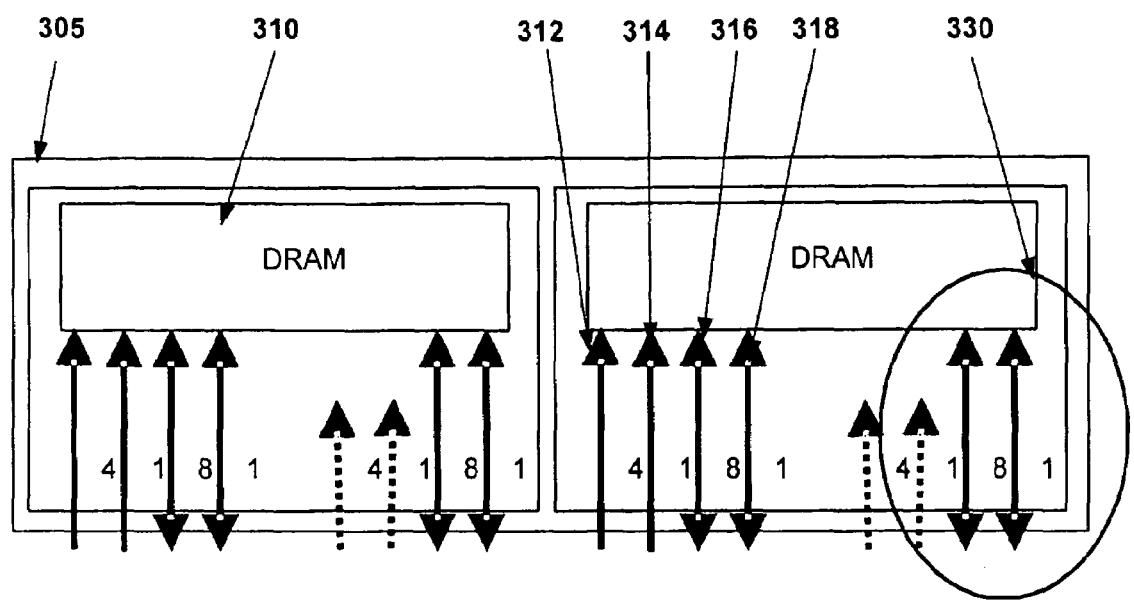
FIG. 3 illustrates a memory chip configuration including memory IO data pins that are used as chip-to-chip interconnects in a stacked topology.

FIG. 3 illustrates a memory chip configuration including memory IO data pins that are used as chip-to-chip interconnects in a stacked topology. Again, FIG. 3 depicts DRAM memory chips, but embodiments may be any memory chip and need not be restricted to DRAM chips.

Module 305 is similar to module 105 includes two DRAMs 310 with a wide data port consisting of multiple interconnects including command lines 312, a clock line 314, data lines 316, a data strobe 318, and another group of command and clock lines as well as another group of data lines and data strobes for each DRAM 310. Module 305 may have unused copies of command and address lines, such as command and clock lines turned off, as represented by the dashed arrows extending only part way to the DRAM. Each DRAM 310 may have more inputs or outputs, but FIG. 3 is restricted to showing those inputs and outputs explained above in order to clarify description. FIG. 3 also depicts host data input and output (IO) that is sent or received through the lines within circle 330.

Figure 4:
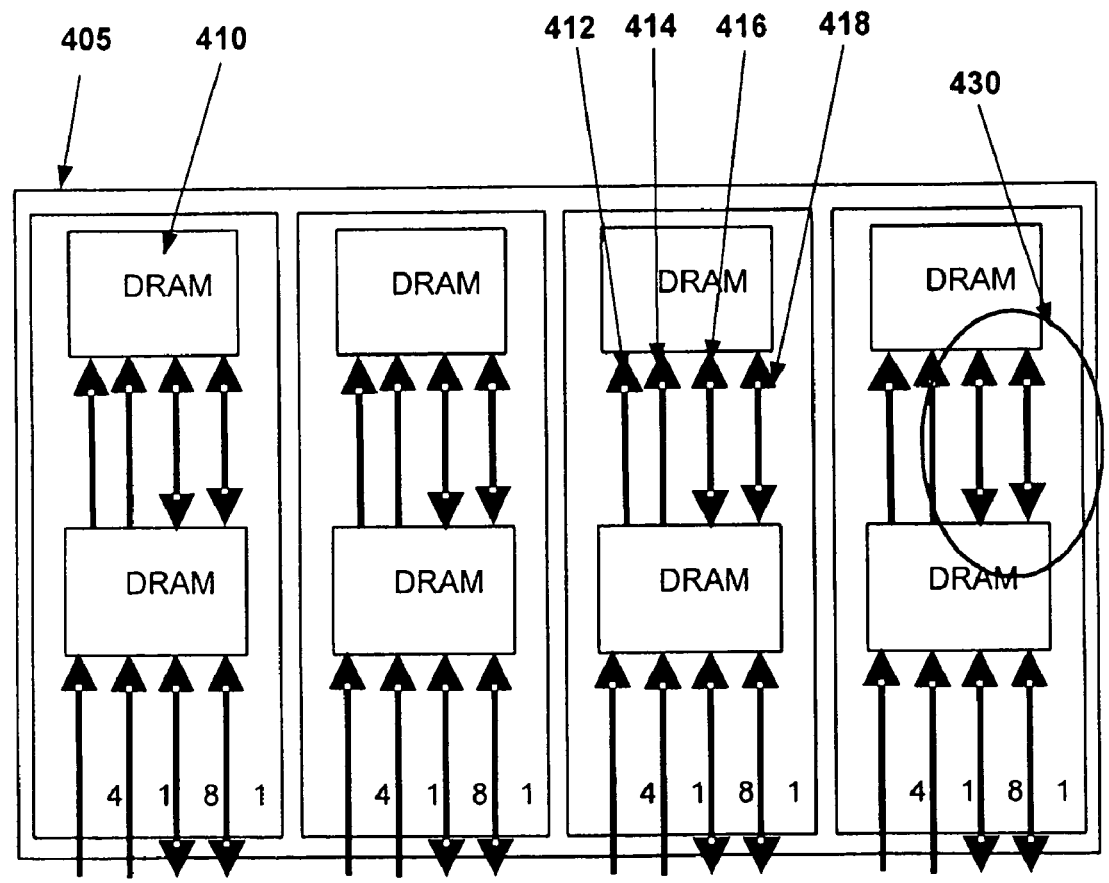
FIG. 4 illustrates a memory chip configuration with a repeater memory chip reusing IO data pins.

FIG. 4 illustrates a memory chip configuration with a repeater memory chip reusing IO data pins. FIG. 4 depicts DRAM memory chips, but embodiments of the invention may be any memory chip and need not be restricted to DRAM chips.

An embodiment achieves a high bandwidth and memory density for stacked device DIMMs. An embodiment may utilize a wide DRAM IO interface of a "x16" DRAM device to allow the same DRAM die to also be used in a "x8" configuration as a DRAM IO repeater without increasing the pin count.

Referring to the embodiment in FIG. 4, module 405 includes multiple DRAMs 410 in a stacked configuration. The DRAMs 410 may be any memory chip and need not be in a stacked configuration but may be in any serially connected chips. FIG. 4 includes command lines 412, a clock line 414, data lines 416, a data strobe 418. The data lines shown circled at 430 represent one half of the host data IO being repeated to a subsequent memory chip, in this case, a DRAM.

In an embodiment, a first DRAM's IO data pins may be used as IO data pins to a second DRAM behind the first DRAM when the first DRAM is configured as a repeater. Consequently, a DRAM device with a wide data port can be used either in a single DRAM configuration to deliver a wide data path to the host, or when the device is used in a stacked configuration the wide data port can be split and the first half can be used to communicate to a host while the second half can communicate to a DRAM device stacked behind it. This topology can be applied to either unidirectional or bidirectional links. An embodiment may comprise using a DRAM configured as a repeater as a normal DRAM, that is, in a device that only utilizes the non-repeating I/O data pins.

An embodiment may be a memory module including a first memory device with data pins, and a second memory device coupled with some of the data pins of the first memory device, where the first memory device can operate as a repeater for the second memory device. In an embodiment the memory module may include memory devices that are dynamic random access memories (DRAM). In an embodiment the memory devices are in a stacked configuration on the memory module. An embodiment may comprise a memory module including memory devices further comprising at least one of a unidirectional and a bidirectional link. In an embodiment the first memory device has 8 data pins that function as a repeater for the second memory device.

An embodiment may include a memory device comprising a memory die and a first plurality of data pins, where the first plurality of data pins can operate as an input or output to the memory die, and a second plurality of data pins to function as a repeater.

In an embodiment the first plurality of data pins and the second plurality of data pins each comprise 8 data pins. In another embodiment, the memory device further comprises at least one of a unidirectional and a bidirectional link to couple with a memory controller. IN another embodiment the memory device may further comprise at least one of a unidirectional and a bidirectional link to couple with another memory device.

A method comprising configuring a first memory device as a repeater, sending data to the first memory device, and forwarding the data to a second memory device.

The method further comprising sending data to the first memory device and storing it on the first memory device.

An embodiment may comprise a method that involves stacking a first and second memory device in one configuration. The present method may further comprise configuring a second memory device as a repeater and forwarding the data to another memory device.

The present embodiment may further comprise configuring a first memory device as a repeater by reserving some of its data pins for forwarding data to other memory devices.

The present invention may be embodied in other specific forms without departing from its spirit or essential characteristics. The described embodiments are to be considered in all respects only as illustrative instead of restrictive or limiting. Therefore, the scope of the invention is indicated by the appended claims rather than by the foregoing description. All changes, modifications, and alterations that come within the meaning, spirit, and range of equivalency of the claims are to be embraced as being within the scope of the appended claims.

The invention claimed is:

1. A system comprising:
a first memory device with data interconnects;
a second memory device coupled with only a portion of the data interconnects of the first memory device, the portion of data interconnects of the first memory device configurable as one of a repeater to send data to the second memory device and as data interconnects to a memory controller; and
a third memory device configured to receive a command line and a clock line from the first memory device, the command and clock lines configured to bypass the second memory device, the first, second and third memory devices being arranged in a stacked configuration.

2. The system of claim 1 wherein the interconnects are at least one of pins and balls.

3. The system of claim 1 wherein each memory device is a dynamic random access memory (DRAM).

4. The system of claim 1, the memory devices further comprising at least one of a unidirectional and a bidirectional link.

5. The system of claim 1 wherein the first memory device can receive data while it is configured as a repeater to the second memory device.

6. A memory device comprising:
a memory die;
a first memory device having a first plurality of data interconnects, the first plurality of data interconnects to operate as input and output to the memory die;
a second memory device having a second plurality of data interconnects, the second plurality of data interconnects configured as a repeater; and
a third memory device having a third plurality of data interconnects, the third memory device configured to receive a command line and a clock line from the first memory device, the command and clock lines configured to bypass the second memory device, the first, second and third memory devices being arranged in a stacked configuration.

7. The memory device of claim 6, wherein the memory device is a DRAM.

8. The memory device of claim 7 wherein the first plurality of data interconnects and the second plurality of data interconnects each comprise 8 data interconnects.

9. The memory device of claim 6 further comprising at least one of a unidirectional and a bidirectional link to couple with a memory controller.

10. The memory device of claim 6 further comprising at least one of a unidirectional and a bidirectional link to couple with another memory device.

11. The memory device of claim 6 wherein the memory device can receive data while it is configured as a repeater.

12. A method comprising:
stacking a first, second and third memory device:
configuring the first memory device as a repeater;
sending data to the first memory device;
forwarding the data to the second memory device from the first memory device; and
sending a command signal and a clock signal from the first memory device to the third memory device to bypass the second memory device.

13. The method of claim 12 wherein the first memory device is a DRAM.

14. The method of claim 12 further comprising sending data to the first memory device and storing it on the first memory device.

15. The method of claim 12 further comprising configuring the second memory device as a repeater and forwarding the data to another memory device.

16. A system comprising:
a first memory die comprising a first plurality of data interconnects, and a second plurality of data interconnects, the second plurality of data interconnects configured as a repeater;
a second memory die with input and output data interconnects, the second memory die in a stacked configuration with the first memory die; and
a third memory die in a stacked configuration with the first and second memory dies, the third memory die configured to receive a command line and a clock line from the first memory die, the command and clock lines configured to bypass the second memory die.

17. The system of claim 16 wherein the first plurality of data interconnects to operate as input and output to the first memory die.

18. The system of claim 16 further comprising separate input and output data lanes to each memory die.

* * * * *